(12) United States Patent
Toumiya et al.

(10) Patent No.: US 8,759,933 B2
(45) Date of Patent: Jun. 24, 2014

(54) SOLID-STATE IMAGE PICKUP ELEMENT, METHOD OF MANUFACTURING THE SAME, AND ELECTRONIC APPARATUS USING THE SAME

(75) Inventors: Yoshinori Toumiya, Kanagawa (JP); Kiyotaka Tabuchi, Kumamoto (JP); Yasuyuki Shiga, Kumamoto (JP); Iwao Sugiura, Kanagawa (JP); Naoyuki Miyashita, Kanagawa (JP); Masanori Iwasaki, Kanagawa (JP); Katsunori Kokubun, Kanagawa (JP); Tomohiro Yamazaki, Kanagawa (JP)

(73) Assignee: Sony Corporation (JP)

( * ) Notice: Subject to any disclaimer, the term of this patent is extended or adjusted under 35 U.S.C. 154(b) by 161 days.

(21) Appl. No.: 12/788,503

(22) Filed: May 27, 2010

(65) Prior Publication Data
US 2011/0024857 A1 Feb. 3, 2011

(30) Foreign Application Priority Data
Jun. 4, 2009 (JP) .................................. 2009-135236

(51) Int. Cl.
*H01L 21/02* (2006.01)
*H01L 27/146* (2006.01)
*H01L 31/0232* (2014.01)

(52) U.S. Cl.
CPC .... *H01L 21/02263* (2013.01); *H01L 27/14685* (2013.01); *H01L 31/02327* (2013.01)
USPC ...................... 257/437; 257/E31.127; 438/72

(58) Field of Classification Search
CPC .................. H01L 31/02327; H01L 27/14625; H01L 27/14685; H01L 21/02263
USPC ............ 257/432, 436, 437, 461, E31.127, 72; 438/69, 72
See application file for complete search history.

(56) References Cited

U.S. PATENT DOCUMENTS

| | | | | |
|---|---|---|---|---|
| 7,534,642 | B2 * | 5/2009 | Choi .................................. | 438/57 |
| 7,666,704 | B2 * | 2/2010 | Suzuki et al. ..................... | 438/69 |
| 7,842,986 | B2 * | 11/2010 | Komoguchi et al. ........... | 257/291 |
| 7,973,271 | B2 * | 7/2011 | Toumiya et al. ............. | 250/208.1 |
| 8,003,929 | B2 * | 8/2011 | Toumiya et al. ............. | 250/208.1 |
| 8,049,153 | B2 * | 11/2011 | Tay et al. ..................... | 250/208.1 |
| 2004/0140564 | A1 * | 7/2004 | Lee et al. ........................ | 257/758 |
| 2005/0159017 | A1 * | 7/2005 | Kim et al. ........................ | 438/791 |
| 2006/0115230 | A1 * | 6/2006 | Komoguchi et al. ........... | 385/146 |
| 2006/0138577 | A1 * | 6/2006 | Hashimoto .................... | 257/432 |

(Continued)

FOREIGN PATENT DOCUMENTS

| | | |
|---|---|---|
| JP | 2006-324293 | 11/2006 |
| JP | 2008-166677 | 7/2008 |

*Primary Examiner* — William F Kraig
*Assistant Examiner* — Joseph C Nicely
(74) *Attorney, Agent, or Firm* — Sheridan Ross P.C.

(57) ABSTRACT

Disclosed herein is a solid-state image pickup element, including: a semiconductor substrate; a pixel portion which is formed on the semiconductor substrate and in which a plurality of pixels each having a photoelectric conversion portion are arranged; an insulating layer formed on the semiconductor substrate so as to cover the photoelectric conversion portion; a hole portion formed in the insulating layer and above the photoelectric conversion portion; a silicon nitride layer formed so as to cover a bottom surface and a side surface of the hole portion; and a buried layer formed on the silicon nitride layer, wherein the silicon nitride layer is formed so as to contain a silicon nitride formed by utilizing an atomic layer deposition method.

19 Claims, 10 Drawing Sheets

(56) References Cited

U.S. PATENT DOCUMENTS

| | | |
|---|---|---|
| 2006/0141653 A1* | 6/2006 | Choi .............................. 438/48 |
| 2007/0138568 A1* | 6/2007 | Nagano et al. ................ 257/369 |
| 2008/0014758 A1* | 1/2008 | Chou et al. .................... 438/761 |
| 2008/0102623 A1* | 5/2008 | Hirota et al. .................. 438/618 |
| 2008/0135732 A1* | 6/2008 | Toumiya et al. ........... 250/208.1 |
| 2008/0248649 A1* | 10/2008 | Adetutu et al. ............... 438/692 |
| 2008/0265353 A1* | 10/2008 | Komoguchi et al. ......... 257/432 |
| 2008/0283728 A1* | 11/2008 | Inoue ......................... 250/208.1 |
| 2009/0039405 A1* | 2/2009 | Cheng et al. ................. 257/311 |
| 2009/0130792 A1* | 5/2009 | Lee et al. ........................ 438/70 |
| 2009/0250777 A1* | 10/2009 | Takamiya ..................... 257/432 |
| 2009/0273085 A1* | 11/2009 | Jourdan et al. ................ 257/751 |
| 2009/0278967 A1* | 11/2009 | Toumiya ....................... 348/294 |
| 2010/0012912 A1* | 1/2010 | Schricker .......................... 257/2 |
| 2010/0283112 A1* | 11/2010 | Tay ............................... 257/432 |
| 2010/0301491 A1* | 12/2010 | Yang ............................. 257/773 |
| 2011/0097838 A1* | 4/2011 | Hashimoto ...................... 438/69 |
| 2011/0248146 A1* | 10/2011 | Toumiya et al. ........... 250/208.1 |
| 2011/0267512 A1* | 11/2011 | Toumiya et al. ............. 348/294 |
| 2011/0269259 A1* | 11/2011 | Tatani et al. .................... 438/73 |
| 2011/0278660 A1* | 11/2011 | Cheng et al. ................. 257/324 |
| 2012/0007018 A1* | 1/2012 | Lee et al. ...................... 252/79.1 |
| 2012/0077300 A1* | 3/2012 | Hashimoto ...................... 438/69 |
| 2012/0161296 A1* | 6/2012 | Lin ............................... 257/635 |
| 2012/0217377 A1* | 8/2012 | Tay ............................ 250/208.1 |

\* cited by examiner

SOLID-STATE IMAGE PICKUP ELEMENT, METHOD OF MANUFACTURING THE SAME, AND ELECTRONIC APPARATUS USING THE SAME

BACKGROUND OF THE INVENTION

1. Field of the Invention

The present invention relates to a MOS (metal oxide semiconductor) type solid-state image pickup element and a method of manufacturing the same, and an electronic apparatus using the same.

2. Description of the Related Art

The scale down of a solid-state image pickup element causes such a problem that an area of a light receiving surface is reduced, an incidence efficiency is reduced, and thus sensitivity characteristics become worse. In order to solve this problem, for example, a solid-state image pickup element is proposed which has a structure adapted to condense a light by using an on-chip lens, an intra-layer lens, or the like. However, adoption of such a structure in the solid-state image pickup element results in the worse sensitivity and shading characteristics due to a loss (eclipse) of a light by a diffusion preventing layer for preventing diffusion of wirings or copper wirings provided in an upper layer of a photodiode.

Also, in addition to the structure described above, there is known a solid-state image pickup element having such a structure that a waveguide structure is provided in insulating layers formed above a photodiode. A solid-state image pickup element having this structure, for example, is described in Japanese Patent Laid-Open No. 2008-166677 (hereinafter referred to as Patent Document 1). In the solid-state image pickup element having this structure, for example, a hole portion is formed above the photodiode in a lamination structure including an insulating layer formed from a $SiO_2$ layer (refractive index: 1.45). Also, a silicon nitride (P—SiN) layer (refractive index: 1.9 to 2.0) is thinly formed so as to cover an inner surface of the hole portion by utilizing a plasma deposition method, and a high-refractive index resin (siloxane containing therein Ti) (refractive index: 1.7) is buried in the entire hole portion through the P—SiN layer.

In the solid-state image pickup element having the waveguide structure described above, the sensitivity characteristics are enhanced as the reference index of the high-refractive index resin layer buried in the entire hole portion is higher.

In the waveguide structure described above, it is possible to expect that when the P—SiN layer formed on the inner surface having the sidewall of the waveguide is thicker, or the entire hole portion of the waveguide is filled with only the P—SiN layer having the larger refractive index, the sensitivity characteristics are enhanced in the photodiode. For this reason, there is also proposed a solid-state image pickup element having a waveguide structure based on such a structure that an entire hole portion of a waveguide is filled with only the P—SiN layer. This solid-state image pickup element having the waveguide structure, for example, is described in Japanese Patent Laid-Open No. 2006-324293 (hereinafter referred to as Patent Document 2).

SUMMARY OF THE INVENTION

However, with the plasma deposition method described in Patent Document 1, a reaction gas is adsorbed on the inner wall surface of the hole portion to chemically dissolve the inner wall surface of the hole portion. However, an opening diameter of the hole portion becomes small with the progress of the film deposition, and thus the reaction gas becomes difficult to enter the hole portion. Therefore, the P—SiN layer is deposited to the vicinity of the opening portion, and thus the opening portion is closed in a state in which a cavity is formed inside the hole portion. Therefore, when the P—SiN layer is desired to be simply, thickly formed, it may be impossible to bury the high-refractive index resin material in the hole portion having a high aspect ratio.

In addition, with the method described in Patent Document 2, the optical waveguide material is buried in the hole portion by utilizing a Chemical Vapor Deposition (CVD) method. With this method, the hole portion is set in a high vacuum state, and a raw material gas and a reaction gas are both supplied to the hole portion to be reacted with each other, thereby depositing the SiN layer on the inner surface of the hole portion. Also, the supply of both the raw material gas and the reaction gas is stopped, and the hole is then set in the high vacuum state again to exhaust the excessive raw material gas and reaction gas. Thus, there is adopted a method of tightly burying the waveguide material in the entire hole portion by repetitively carrying out these two processes.

However, with the method described in Patent Document 2, for the purpose of forming the uniform film having the excellent coatability, the thin film having the excellent coatability needs to be deposited in multiple stages in the hole portion. For this reason, the deposition rate is very low, and thus it may be impossible to obtain a realistic throughput.

The present invention has been made in order to solve the problems described above, and it is therefore desirable to provide a solid-state image pickup element having a waveguide structure which can be manufactured with a satisfactory throughput, and a method of manufacturing the same which is excellent in productivity, and an electronic apparatus using the same.

In order to attain the desire described above, according to an embodiment of the present invention, there is provided a solid-state image pickup element including: a semiconductor substrate; a pixel portion which is formed on the semiconductor substrate and in which a plurality of pixels each having a photoelectric conversion portion are arranged; and an insulating layer formed on the semiconductor substrate so as to cover the photoelectric conversion portion. The element further includes: a hole portion formed in the insulating layer and above the photoelectric conversion portion; a silicon nitride layer formed so as to cover a bottom surface and a side surface of the hole portion; and a buried layer formed on the silicon nitride layer. In the element, the silicon nitride layer is formed so as to contain a silicon nitride formed by utilizing an atomic layer deposition method.

According to another embodiment of the present invention, there is provided a method of manufacturing a solid-state image pickup element including the steps of: forming a photoelectric conversion portion in a pixel portion of a semiconductor substrate; forming an insulating layer on the semiconductor substrate so as to cover the photoelectric conversion portion; forming a hole portion in the insulating layer and above the photoelectric conversion portion; and forming a silicon nitride layer in the hole portion; in which the silicon nitride layer is formed by utilizing an atomic layer deposition method.

In the solid-state image pickup element and the method of manufacturing a solid-state image pickup element, the hole portion is formed in the insulating layer and above the photoelectric conversion portion, and the silicon nitride layer is formed in the hole portion by utilizing the atomic layer deposition method. Since the silicon nitride layer formed by utilizing the atomic layer deposition method has the high coatability for the hole portion, the opening of the hole portion is not closed even when the silicon nitride layer is thickly formed on the sidewall of the hole portion. For this reason, it is possible to make the waveguide structure such that the silicon nitride layer is formed thickly in the hole portion, and thus it is possible to enhance the sensitivity characteristics of the solid-state image pickup element.

In addition, there is not adopted such a waveguide structure that the silicon nitride layer formed by utilizing the atomic layer deposition method is buried in the entire hole portion. Therefore, it is possible to suppress the deterioration of the throughput in the phase of manufacture due to the deposition rate of the silicon nitride layer formed by utilizing the atomic layer deposition method. For this reason, it is possible to enhance the productivity of the solid-state image pickup element including the waveguide structure described above.

According to still another embodiment of the present invention, there is provided an electronic apparatus including: a solid-state image pickup element including a semiconductor substrate, a pixel portion which is formed on the semiconductor substrate and in which a plurality of pixels each having a photoelectric conversion portion are arranged, an insulating layer formed on the semiconductor substrate so as to cover the photoelectric conversion portion, a hole portion formed in the insulating layer and above the photoelectric conversion portion, a silicon nitride layer formed so as to cover a bottom surface and a side surface of the hole portion, and a buried layer formed on the silicon nitride layer, the silicon nitride layer being formed so as to contain a silicon nitride formed by utilizing an atomic layer deposition method. The apparatus further includes: an optical system for guiding an incident light to an image pickup portion of the solid-state image pickup element; and a signal processing circuit for processing an output signal from the solid-state image pickup element.

The electronic apparatus includes the solid-state image pickup element according to the embodiment of the present invention, which results in that it is possible to enhance the sensitivity characteristics based on the waveguide structure, and it is also possible to enhance the throughput in the phase of manufacture.

As set forth hereinabove, according to the embodiments of the present invention, it is possible to provide the solid-state image pickup element including the waveguide structure which is excellent in productivity and the method of manufacturing the same, and the electronic apparatus using the same.

DETAILED DESCRIPTION OF THE PREFERRED EMBODIMENTS

The preferred embodiments of the present invention will be described in detail hereinafter with reference to the accompanying drawings. However, the present invention is by no means limited thereto.

It is noted that the description will be given in accordance with the following order.

1. MOS type Solid-State Image Pickup Element
2. Method of Manufacturing MOS Type Solid-State Image Pickup Element
3. Electronic Apparatus 1. MOS Type Solid-State Image Pickup Element
Structure of MOS Type Solid-State Image Pickup Element: Schematic Structural View Hereinafter, a MOS type solid-state image pickup element according to an embodiment of the present invention will be described in detail.

Figure 1:
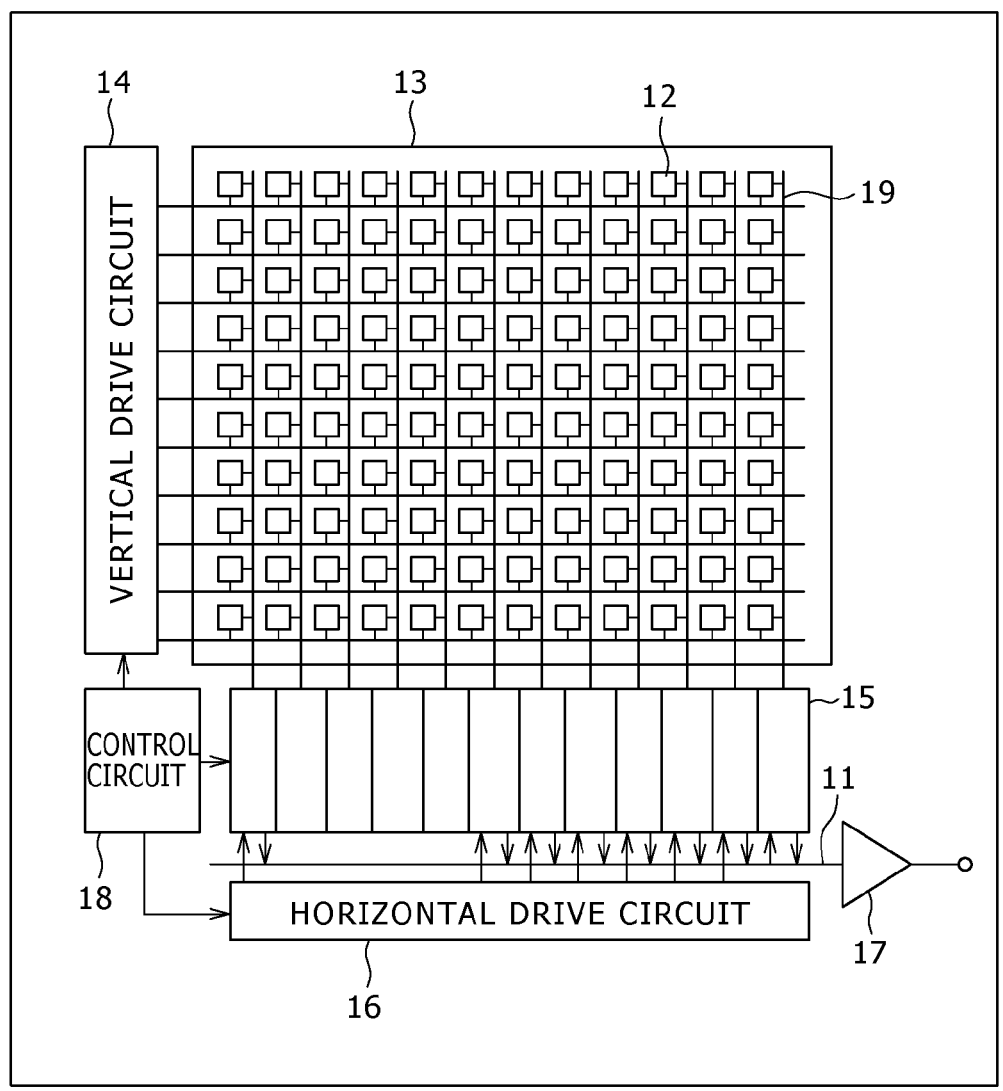
FIG. 1 is a schematic view showing a structure and a configuration of a solid-state image pickup element according to an embodiment of the present invention.

FIG. 1 shows schematically a structure and a configuration of the MOS type solid-state image pickup element as an example of the solid-state image pickup element of the embodiment.

The MOS type solid-state image pickup element shown in FIG. 1 is composed of a pixel portion (a so-called image pickup area) 13 and a peripheral circuit portion. In this case, in the pixel portion 13, a plurality of pixels 12 including a plurality of photodiodes each becoming a photoelectric conversion portion are regularly, two-dimensionally arranged on a semiconductor substrate, for example, a silicon substrate. Also, each of the pixels 12 includes the photodiode and a plurality of pixel transistors (so-called MOS transistors).

A plurality of pixel transistors, for example, can be composed of three transistors of a transfer transistor, a reset transistor, and an amplification transistor. In addition thereto, a plurality of pixel transistors may also be composed of four transistors of these three transistors and a selection transistor added thereto.

The peripheral circuit portion is composed of a vertical drive circuit 14, a column signal processing circuit 15, a horizontal drive circuit 16, an output circuit 17, a control circuit 18, and the like.

The control circuit 18 generates a clock signal and a control signal becoming references for operations of the vertical drive circuit 14, the column signal processing circuit 15, the horizontal drive circuit 16, and the like synchronously with a vertical synchronous signal, a horizontal synchronous signal, and a master clock signal. The control circuit 18 inputs the clock signal and the control signal to each of the vertical drive circuit 14, the column signal processing circuit 15, the horizontal drive circuit 16, and the like.

The vertical drive circuit 14, for example, is composed of a shift register. The vertical drive circuit 14 successively selectively scans the pixels 12 of the pixel portion 13 in rows in a vertical direction, and supplies pixel signals based on signal charges generated so as to correspond to quantities of lights in the photoelectric conversion elements of the respective pixels 12 to the column signal processing circuits 15 through respective vertical signal lines 19.

The column signal processing circuit 15, for example, is disposed every column of the pixels 12, and executes signal processing such as noise removing processing for signals outputted from the pixels 12 for one row based on signals from black reference pixels every pixel column. Here, the black reference pixels are formed in the periphery of an effective pixel area. That is to say, the column signal processing circuit 15 executes the signal processing such as Correlated Double Sampling (CDS) for removing fixed pattern noises peculiar to the pixels 12, and the signal amplification. Also, a horizontal selection switch (not shown) is connected between an output stage of the column signal processing circuit 15, and the horizontal signal line 11.

The horizontal drive circuit 16, for example, is composed of a shift register. Also, the horizontal drive circuit 16 successively outputs horizontal scanning pulses to select the column signal processing circuit 15 in order, thereby outputting the pixel signals from the respective column signal processing circuits 15 to the horizontal signal line 11.

The output circuit 17 executes signal processing for the signals which are supplied thereto from the respective column signal processing circuits 15 in order through the horizontal signal line 11, and outputs the resulting signals.

Structure of MOS Type Solid-State Image Pickup Element: Sectional View

Figure 2:
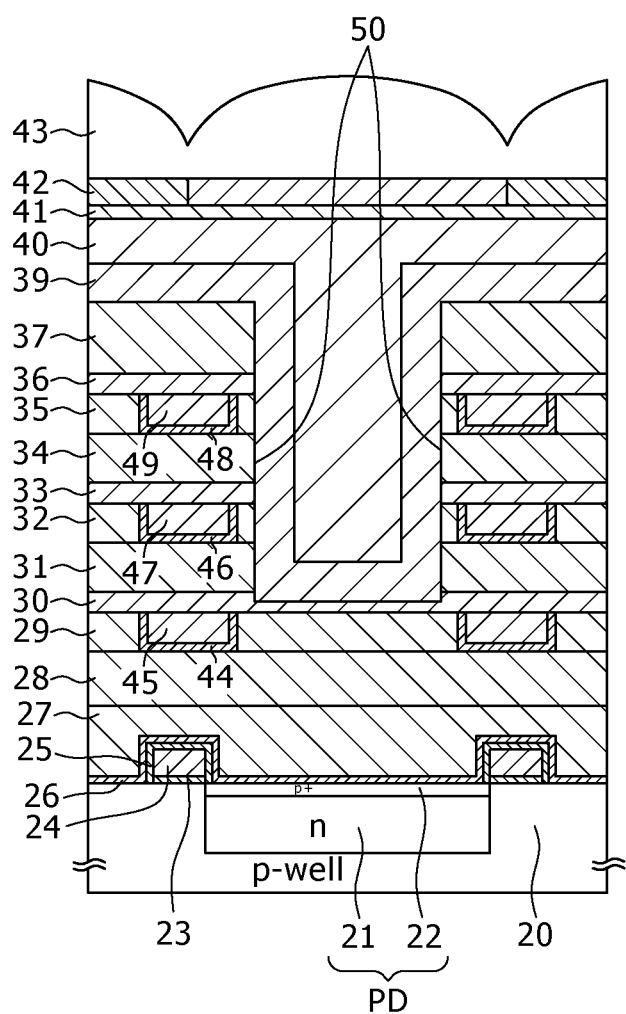
FIG. 2 is a cross sectional view showing a structure of a unit pixel in the solid-state image pickup element according to the embodiment of the present invention.

FIG. 2 shows a cross sectional view of the MOS type solid-state image pickup element 10 described above. It is noted that a unit pixel, of the MOS type solid-state image pickup element 10, composed of a photodiode PD and a plurality of MOS transistors Tr is shown in FIG. 2.

For example, in the pixel 12 becoming the light receiving surface, a charge accumulating layer composed of a semiconductor region 21 of a second conductivity type, for example, an n-type is formed every pixel in a semiconductor region of a first conductivity type, for example, a p-type well region of a semiconductor substrate 20. Also, a surface layer composed of a semiconductor region 22 of the high impurity concentrated first conductivity type, for example, a $p^+$-type is formed in a surface layer of the charge accumulating layer. As a result, a photodiode PD is structured based on a pn junction between the n-type semiconductor region 21, and $p^+$-type semiconductor region 22. In addition, a gate insulating layer 23 and a gate electrode 24 are formed in this order on the semiconductor substrate 20 so as to be adjacent to the photodiode PD.

For example, a signal reading portion, such as a floating diffusion and a charge transfer path, for reading out the signal charges generated and accumulated in the photodiode PD, or a voltage corresponding to the signal charges is formed on the semiconductor substrate 20 described above. Also, the signal charges are transferred from the photodiode PD to a predetermined portion by applying a voltage to the gate electrode 24.

In addition, a silicon nitride layer (LP-SiN film) having an operation as an anti-reflection layer 26 is formed by utilizing a low pressure Chemical Vapor deposition (CVD) method so as to cover the entire surface of the gate electrode 24, the photodiode PD, and the semiconductor substrate 20. In addition, a first insulating layer 25 is interposed between the gate electrode 24 and the anti-reflection layer 26 so as to cover the gate electrode 24.

A second insulating layer 27, a third insulating layer 28, a fourth insulating layer 29, a fifth insulating layer 31, a sixth insulating layer 32, a seventh insulating layer 34, an eighth insulating layer 35, and a ninth insulating layer 37 are formed in this order on the anti-reflection layer 26 so as to cover the photodiode PD and the semiconductor substrate 20. Each of the insulating layers 27 to 29, 31 and 32, 34 and 35, and 37 is made of a silicon oxide or the like.

In addition, a first diffusion preventing layer 30, a second diffusion preventing layer 33, and a third diffusion preventing layer 36 each, for example, made of a silicon carbide are formed in this order.

The insulating layers 27 to 29, 31 and 32, 34 and 35, and 37, and the diffusion preventing layers 30, 33 and 36 are laminated, thereby structuring insulating layers having a multi-layer structure on the semiconductor substrate 20.

A wiring trench is formed in the fourth insulating layer 29 described above. Also, a first wiring layer composed of a barrier metal layer 44 made of tantalum/tantalum nitride, for example, formed in a damascene process, and a conductive layer 45 made of copper is buried in this wiring trench. Likewise, a second wiring layer composed of a barrier metal layer 46 and the conductive layer 47 is buried in a wiring trench formed in the sixth insulating layer 32. In addition, a third wiring layer composed of a barrier metal layer 48 and a conductive layer 49 is buried in a wiring trench formed in the eighth insulating layer 35.

The first to third diffusion preventing layers 30, 33 and 36 are formed in order to prevent the diffusion of copper forming the first to third conductive layers 45, 47 and 49, respectively.

As has been described, the wiring structure is adopted such that the wiring layers are buried in the respective wiring trenches formed in the respective insulating layers. However, a wiring structure may also be adopted such that each wiring, for example, is formed integrally with a contact portion in an opening portion extending from a bottom surface of the wiring trench to a lower layer wiring in a dual damascene process.

A hole portion 50 is formed in the insulating layers having the lamination structure, that is, in the fifth to ninth insulating layers 31, 32, 34, 35, and 37, and the first to third diffusion preventing layers 30, 33 and 36 and above the photodiode PD. The hole portion 50 is formed so as to extend completely from the ninth insulating layer 37 as the uppermost layer of the insulating layers having the lamination structure to the fifth insulating layer 31 and penetrate into a part of the first diffusion preventing layer 30 as the lowermost diffusion preventing layer. For this reason, the first diffusion preventing layer 30 as the lowermost diffusion preventing layer forms a bottom surface of the hole portion 50.

Although depending on an area of the photodiode PD, a pixel size of the MOS type solid-state image pickup element, a process rule, and the like, the hole portion 50 described above, for example, is formed in such a way that an opening diameter is set at about 0.8 μm, and an aspect ratio is approximately set at 1 to 2 or more. In addition, for example, an inner wall surface of the hole portion 50 is structured in the form of a surface which is either vertical to a principal surface of the semiconductor substrate 20 or approximately vertical to the principal surface of the semiconductor substrate 20. Or, the hole portion 50 may also be structured in the form of a forward tapered opening shape which becomes wider toward the upper side in a portion of the ninth insulating layer 37 as an edge portion of the hole portion 50.

A silicon nitride (refractive index: 2.0) layer 39 having a larger refractive index than that of a silicon oxide (refractive index: 1.45) forming the ninth insulating layer 37 is formed so as to cover an inner surface having an inner wall of the hole portion 50. In addition, the silicon nitride layer 39 is made of a silicon nitride (ALD-SiN) formed by utilizing the Atomic Layer Deposition (ALD) method.

The silicon nitride layer 39 made of ALD-SiN is thickly formed on the sidewall of the hole portion 50, thereby making it possible to enhance the sensitivity characteristics. A relationship between the sensitivity characteristics of the MOS type solid-state image pickup element, and the thickness of the silicon nitride layer 39 formed on the inner surface of the hole portion 50 will be described concretely in an example which will be described below.

In addition, the silicon nitride layer 39 can also be formed by combining the ALD-SiN layer with a silicon nitride (P—SiN) layer by utilizing the plasma deposition method.

The film deposition rate is lower in the ALD method than in the plasma deposition method. As a result, when the silicon nitride layer 39 is thickly formed, it takes a lot of time to form the silicon nitride layer 39, and thus it is difficult to obtain the realistic throughput in the actual process for manufacturing the MOS type solid-state image pickup element. For this reason, the ALD-SiN layer is combined with the P—SiN layer formed at the larger deposition rate, thereby making it possible to form the silicon nitride layer having the structure which is excellent in both coatability and deposition rate.

In addition, for example, a buried layer 40 having a higher reflective index than that of the silicon oxide is formed on the silicon nitride layer 39 so as to be buried in the hole portion 50.

The buried layer 40, for example, is made of a high-refractive index resin such as a siloxane system resin (refractive index: 1.7) or polyimide. In addition, a metallic oxide fine particle, for example, made of a titanium oxide, a tantalum oxide, a niobium oxide, a tungsten oxide, a zirconium oxide, a zinc oxide, an indium oxide, a hafnium oxide or the like is contained in the high-refractive index resin described above, thereby making it possible to increase the refractive index. In particular, siloxane containing therein highly concentrated TiO is preferably used.

Also, a planarizing resin layer 41 which, for example, acts as an adhesive layer as well is formed on the buried layer 40. Also, a color filter 42, for example, having blue (B), green (G) and red (R) is formed every pixel on the planarizing resin layer 41, and an on-chip lens 43 is formed on the color filter 42.

According to the MOS type solid-state image pickup element having the structure described above, a waveguide structure is formed in the insulating layers 27 to 29, 31 and 32, 34 and 35, and 37, and the diffusion preventing layers 30, 33 and 36 thus laminated by burying the silicon nitride layer 39, and the buried layer 40 formed from the high-refractive index resin layer in the hole portion 50 formed above the photodiode PD.

In the case of the P—SiN layer which has been used in forming the waveguide structure in related art, it is difficult to control the thickness thereof, so that the clearance of the hole portion 50 becomes narrow. As a result, it is difficult to bury the high-refractive index resin layer in the hole portion 50 having the narrow clearance. On the other hand, since the silicon nitride (ALD-SiN) layer formed by utilizing the atomic layer deposition (ALD) method is excellent in coatability, the problem about the clearance as with the P—SiN layer is not caused. However, since the ALD-SiN layer is low in deposition rate, it takes a lot of time to deposit the SiN layer. For example, it takes 48 hours or more to bury the ALD-SiN layer in the hole portion having a diameter of 700 nm.

On the other hand, the MOS type solid-state image pickup element of the embodiment described above has the waveguide structure having such a structure that the SiN layer formed from the ALD-SiN layer having the high coatability and having the high refractive index is formed on the inner surface of the hole portion, and moreover the buried layer made of the high-refractive index resin material or the like is buried in the entire hole portion through the SiN layer. Since although the ALD-SiN layer is low in deposition rate, the ALD-SiN layer is excellent in coatability, the opening of the hole portion is not closed even when the silicon nitride layer is thickly formed on the inner surface having the sidewall of the hole portion. For this reason, the high-refractive index resin material can be buried in the hole portion through the silicon nitride layer even when the silicon nitride layer is thickly formed on the inner surface of the hole portion. That is to say, it is possible to obtain the waveguide structure such that the silicon nitride layer can be thickly formed on the inner surface having the sidewall of the waveguide hole portion. Thus, it is possible to provide the MOS type solid-state image pickup element in which the sensitivity characteristics, and the dependency of the sensitivity on the F number are enhanced. In addition, after the silicon nitride layer made of ALD-SiN is formed on the inner surface, i.e., on the bottom surface and the sidewall of the hole portion, the buried layer made of the high-refractive index resin or the like is buried in the hole portion through the silicon nitride layer. For this reason, when only the ALD-SiN layer is buried in the hole portion, it may be impossible to obtain the realistic throughput due to the problem about the deposition rate. However, by using the formation of the buried layer in combination, it is possible to enhance the productivity. Therefore, according to the MOS type solid-state image pickup element having the structure described above, it is possible to enhance the sensitivity due to the waveguide structure, and it is also possible to obtain the throughput having the possibility of the mass production.

EXAMPLES

Relationship Between Thickness of Silicon Nitride Layer and Sensitivity of Solid-State Image Pickup Element Next, a description will be given with respect to a relationship between the thickness of the silicon nitride layer 39 formed on the inner surface of the hole portion 50, and the sensitivity characteristics.

Figure 3:
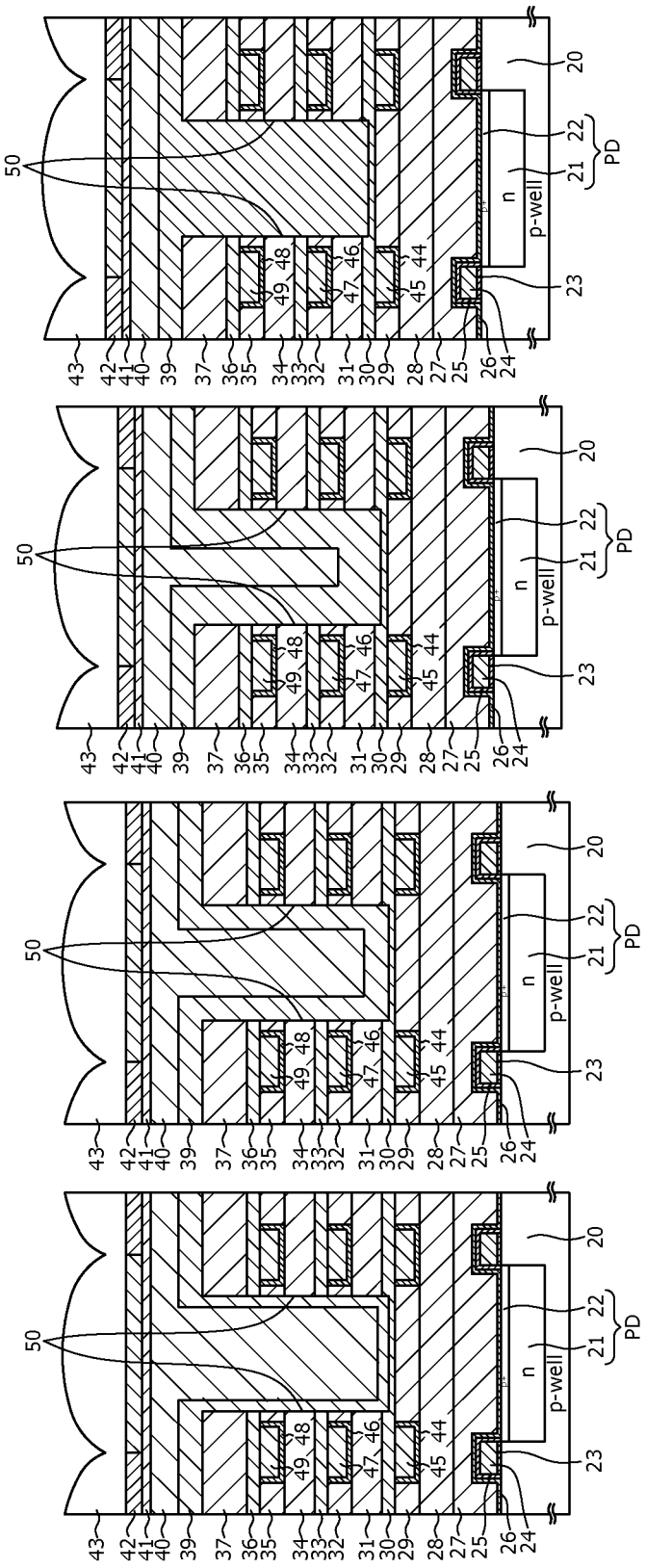
FIGS. 3A to 3D are respectively cross sectional views showing structures of examples of the solid-state image pickup element of the embodiment manufactured while a thickness of a silicon nitride layer is changed.

FIGS. 3A to 3D respectively show examples of MOS type solid-state image pickup elements manufactured while the thickness of the silicon nitride layer 39 is changed. It is noted that since in each of FIGS. 3A to 3D, the structure of the constituent elements other than the silicon nitride layer 39 and the buried layer 40 is the same as that of the constituent elements shown in FIG. 2, a description thereof is omitted here for the sake of simplicity. FIG. 3A shows an example of a structure of the MOS type solid-state image pickup element manufactured when the thickness of the silicon nitride layer 39 is set at 50 nm. FIG. 3B shows an example of a structure of the MOS type solid-state image pickup element manufactured when the thickness of the silicon nitride layer 39 is set at 100 nm. FIG. 3C shows an example of a structure of the MOS type solid-state image pickup element manufactured when the thickness of the silicon nitride layer 39 is set at 150 nm. Also, FIG. 3D shows an example of a structure of the MOS type solid-state image pickup element manufactured when only the silicon nitride layer 39 is filled in the entire hole portion 50.

Figure 4:
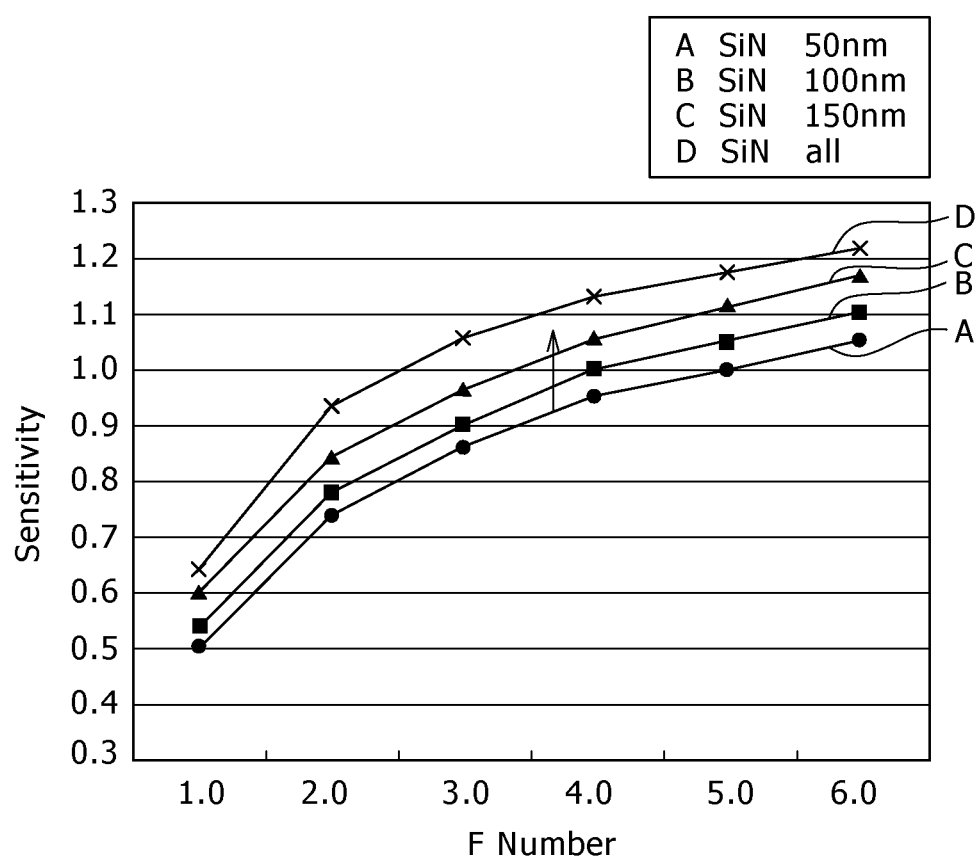
FIG. 4 is a graph representing a relationship between a thickness of the silicon nitride layer and a sensitivity.

FIG. 4 shows results of carrying out simulations about the sensitivity characteristics of the MOS type solid-state image pickup elements shown in FIGS. 3A to 3D, respectively. The results shown in FIG. 4 are normalized with the case where the thickness of the silicon nitride layer 39 is set at 50 nm, and an F number is 5.6 as a reference. In FIG. 4, an ordinate axis represents the sensitivity, of each of the MOS type solid-state image pickup elements, thus normalized, and an abscissa axis represents the F number.

As shown in FIG. 4, it is understood that at the same F number, the sensitivity increases as the thickness of the silicon nitride layer 39 becomes larger. This relationship is established in all the F numbers, that is, the same result is obtained in all the F numbers. When the F number is smaller, a quantity of light which is made obliquely incident to the MOS type solid-state image pickup element becomes much in a light made incident to the MOS type solid-state image pickup element. Therefore, even in the situation in which a quantity of light which is made obliquely incident to the MOS type solid-state image pickup element becomes much, the thickness of the silicon nitride layer is increased, thereby making it possible to increase the sensitivity of the MOS type solid-state image pickup element.

In addition, in the waveguide structure, the sensitivity of the MOS type solid-state image pickup element increases as the thickness of the silicon nitride layer is larger. In particular, only the silicon nitride layer 39 is buried in the entire hole portion 50, thereby obtaining the highest sensitivity in the MOS type solid-state image pickup element. From this result, for enhancement of the sensitivity, the thickness of the silicon nitride layer is preferably increased. In particular, it is expected that the waveguide structure having such a structure that only the silicon nitride layer 39 is buried in the entire hole portion 50 is obtained, thereby making it possible to further enhance the sensitivity.

2. Method of Manufacturing MOS Type Solid-State Image Pickup Element

Embodiment of Manufacturing Method of MOS Type Solid-State Image Pickup Element

An embodiment of a method of manufacturing the MOS type solid-state image pickup element according to the present invention will be described in detail with reference to FIGS. 5A to 5G.

Figure 5A:
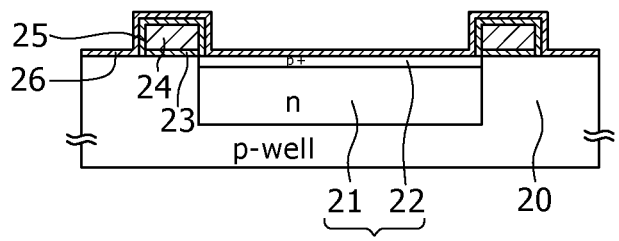
FIGS. 5A to 5G are respectively cross sectional views showing respective processes for manufacturing the solid-state image pickup element according to the embodiment of the present invention in a method of manufacturing the solid-state image pickup element according to another embodiment of the present invention.

Firstly, as shown in FIG. 5A, the charge accumulating layer as the semiconductor region 21 of the second conductivity type, for example, the n-type is formed in the semiconductor region of the first conductivity type, for example, the p-type well region of the semiconductor substrate (for example, the silicon wafer) 20. Also, the surface layer composed of the semiconductor region 22 of the high impurity concentrated first conductivity type, for example, the $p^+$-type is formed in the surface layer of the semiconductor region 21 of the second conductivity type. Also, the photoelectric conversion portion composed of the photodiode PD having the pn junction is formed. In addition, the gate insulating layer 23 and the gate electrode 24 are formed in this order adjacent to the photodiode PD. In addition, there is formed the signal reading portion, composed of the floating diffusion, the CCD charge transfer path and the like (each not shown), for reading out either the signal charges generated and accumulated in the photodiode PD, or the voltage corresponding to the signal charges.

Moreover, the first insulating layer 25 and the anti-reflection layer 26 are formed in this order so as to cover the gate electrode 24. The anti-reflection layer 26 is formed from the silicon nitride (LP-SiN) layer by utilizing the low pressure CVD method so as to cover the entire surface of the gate electrode 24, the photodiode PD, and the semiconductor substrate 20.

Figure 5B:
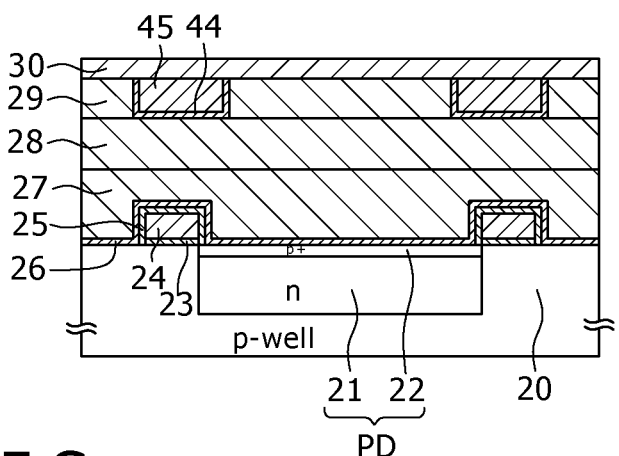

Next, as shown in FIG. 5B, the silicon oxide is deposited by utilizing the CVD method or the like so as to cover the entire surface of the anti-reflection layer 26, thereby forming the second insulating layer 27. Next, the silicon oxide, for example, is deposited on the second insulating layer 27, thereby forming the third insulating layer 28, and the silicon oxide is then deposited on the third insulating layer 28, thereby forming the fourth insulating layer 29.

Next, the wiring trench 29A is formed in the fourth insulating layer 29 by, for example, carrying out the etching processing. Also, a tantalum/tantalum oxide is deposited so as to cover the inner surface of the wiring trench 29A by utilizing the sputtering method, thereby forming the barrier metal layer 44. Also, after a seed layer made of copper is formed over the entire surface, a copper film is deposited over the entire surface by carrying out electrolytic plating processing, and the copper film other than the copper wiring formed in the wiring trench 29A is removed away by utilizing a Chemical Mechanical Polishing (CMP) method or the like, thereby forming the first conductive layer 45. At this time, the barrier metal layer formed outside the wiring trench 29A is also removed away. The wiring layer composed of the barrier metal layer 44 formed on the inner surface of the wiring trench 29A, and the first conductive layer 45 buried in the wiring trench 29A through the barrier metal layer 44 is formed in the manner described above.

Also, the silicon carbide (SiC) is deposited on the first conductive layer 45 and the fourth insulating layer 29 by, for example, utilizing the CVD method, thereby forming the first diffusion preventing layer 30.

Figure 5C:
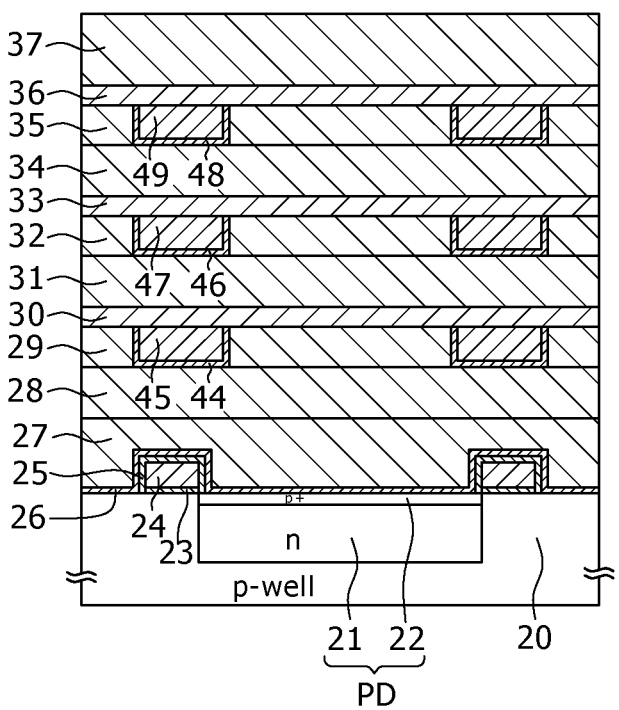

Next, as shown in FIG. 5C, the fifth insulating layer 31, the sixth insulating layer 32, the barrier metal layer 46, the second conductive layer 47, and the second diffusion preventing layer 33 are formed in this order on the first diffusion preventing layer 30. In addition, the seventh insulating layer 34, the eighth insulating layer 35, the barrier metal layer 48, the third conductive layer 49, the third diffusion preventing layer 36, and the ninth insulating layer 37 are formed in this order on the second diffusion preventing layer 33.

These structures can be formed by repetitively carrying out the same process as that for forming the second insulating layer 27, the third insulating layer 28, the fourth insulating layer 29, the wiring trench 29A, the barrier metal layer 44, the first conductive layer 45, and the first diffusion preventing layer 30 which are all shown in FIG. 5B.

As each of the wiring layers described above, the wiring structure may also be adopted such that each wiring, for example, is formed integrally with the contact portion in the opening portion extending from the bottom surface of the wiring trench to the lower layer wiring in the dual damascene process.

Figure 5D:
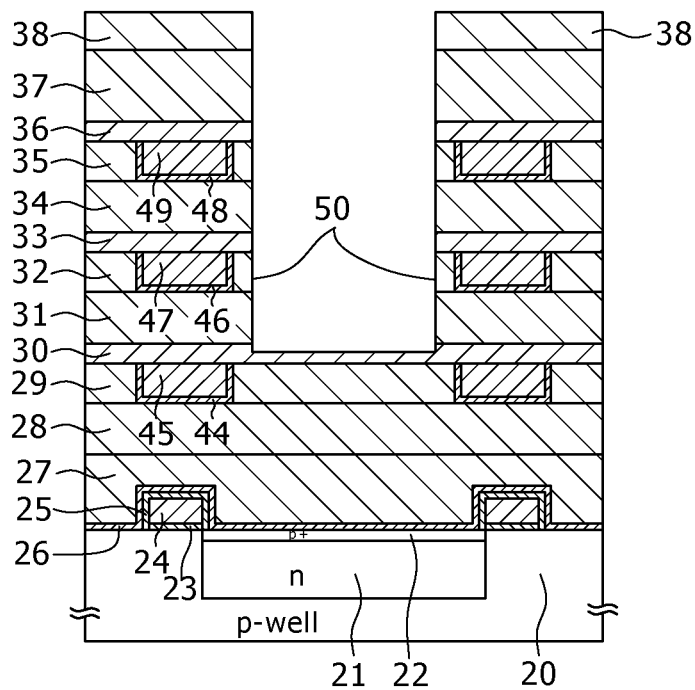

Next, as shown in FIG. 5D, for example, for the purpose of forming the hole portion 50 by utilizing the photolithography process, a pattern of a photo resist layer 38 is formed, and anisotropic etching such as reactive ion etching is then carried out. In this process, the hole portion 50 is formed so as to extend completely through the fifth to ninth insulating layers 31, 32, 34, 35, and 37, and the second and third diffusion preventing layers 33 and 36 and penetrate into a part of the surface of the first diffusion preventing layer 30. That is to say, the remaining part of the first diffusion preventing layer 30 is exposed in the bottom of the hole portion 50.

The opening for the hole portion 50, for example, is carried out while the etching conditions are changed depending on the material such as the silicon oxide or the silicon carbide. Also, the anisotropic etching is quickly stopped at a time point when the bottom portion of the opening reaches the first diffusion preventing layer 30. That is to say, the first diffusion preventing layer 30 is made of the silicon carbide, and is used as an etching stopper against the anisotropic etching. As a result, the first diffusion preventing layer 30 becomes the bottom surface of the hole portion 50. The first diffusion preventing layer 30 is made the bottom surface of the hole portion 50, whereby the depth of the hole portion 50 can be stably obtained. For this reason, a distance between the photodiode PD and the optical waveguide becomes constant, and thus it is possible to prevent the dispersion of the sensitivity characteristics for each pixel.

The hole portion 50 described above, for example, is formed in such a way that the opening diameter is set at about 0.8 μm, and the aspect ratio is approximately set at 1 to 2 or more.

Figure 5E:
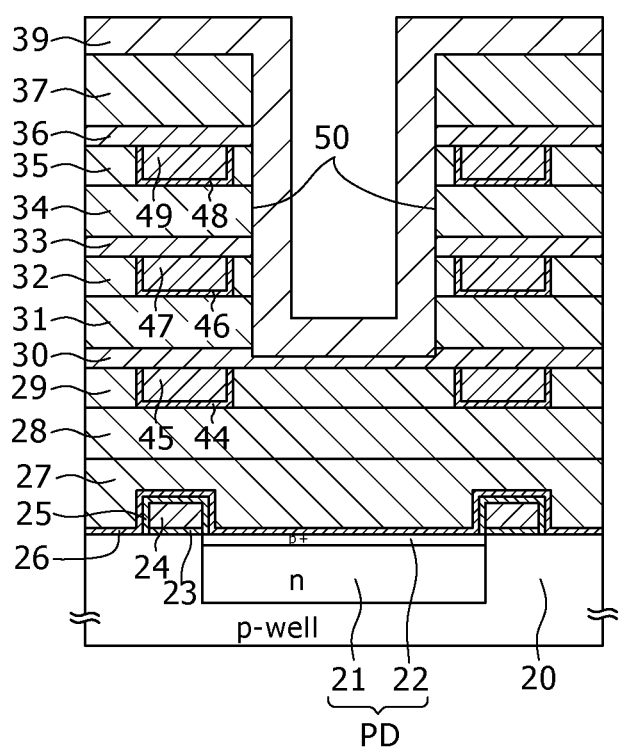

Next, as shown in FIG. 5E, after the photo resist layer 38 is removed away, the silicon nitride layer 39 is formed so as to cover the inner surface having the inner wall and the bottom portion of the hole portion 50, and the ninth insulating layer 37. The silicon nitride layer 39 is formed by depositing the silicon nitride (ALD-SiN) layer by utilizing the Atomic Layer Deposition (ALD) method.

The forming conditions for the ALD-SiN layer will be described below. The film deposition conditions in the ALD method when adsorption of Si in a series of processes of the ALD method is set as a step 1, and nitriding of adsorbed Si is set as a step 2 are shown below as an example of formation of the ALD-SiN layer.

Deposition Temperature

A deposition temperature is set in the range of 320 to 600° C. in each of the steps 1 and 2.

RF Power

In a phase of nitriding of the step 2, an RF power is set in the range of 100 to 500 W.

Kinds of Gases

Dichlorosilane is used as a Si adsorption gas in the step 1, and ammonia is used as a nitriding gas in the step 2.

It is noted that in the step 1, monosilane, hexachloride disilane, or bis tertial butyl amino silane (BTBAS) can also be used as the Si adsorption gas in addition to dichlorosilane.

Gas Flow Rate

Dichlorosilane in the step 1 is caused to flow at a flow rate of 500 to 3,000 sccm, and ammonia in the step 2 is caused to flow at a flow rate of 500 to 5,000 sccm, thereby forming the silicon nitride layer.

Time

A process for carrying out the step 1 for 1 to 10 seconds, and a process for carrying out the step 2 for 10 to 120 seconds are set as one cycle, and the two processes are alternately, repetitively processed, thereby forming the ALD-SiN layer having a desired thickness. At this time, it is estimated that the nitride film having a thickness of 0.6 to 1.2 Å is formed per one cycle. In addition, the residual gas in each of the steps 1 and 2 is exhausted from a reaction tube based on $N_2$ purge between the steps 1 and 2.

It should be noted that the silicon nitride layer 39 may also be formed by combining the ALD-SiN layer described above with the silicon nitride (P—SiN) layer formed by utilizing the plasma deposition method.

The P—SiN layer can be formed by depositing the silicon nitride by utilizing the plasma CVD method in which the deposition temperature is set at about 380° C.

In this case, for formation of the silicon nitride layer 39, any of the ALD-SiN layer and the P—SiN layer may be firstly formed on the inner surface of the hole portion 50, or the ALD-SiN layer and the P—SiN layer may be alternately formed on the inner surface of the hole portion 50.

Addition of the process for forming the P—SiN layer to the process for forming the ALD-SiN layer can shorten a period of time for formation of the silicon nitride layer 39.

Figure 5F:
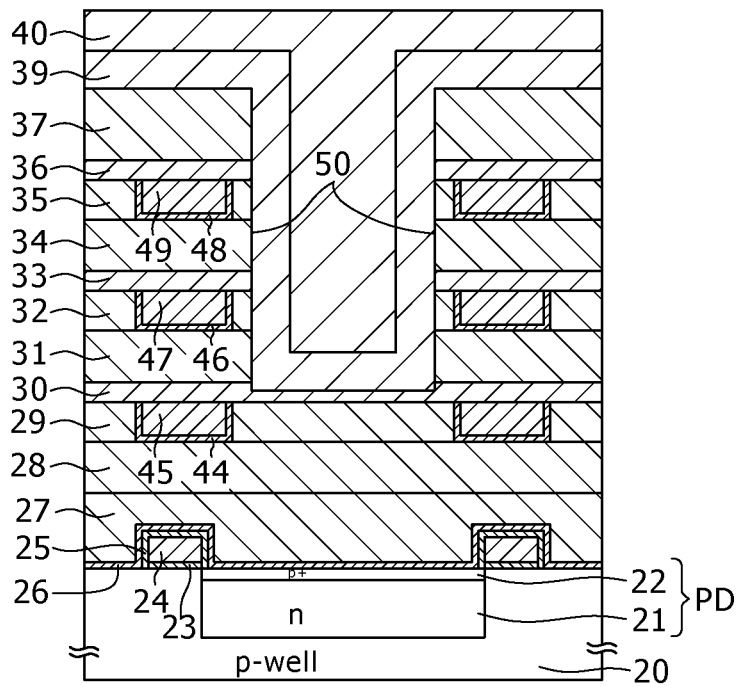

Next, as shown in FIG. 5F, the buried layer 40 made of the high-refractive index resin is buried in the entire hole portion 50 and formed on the silicon nitride layer 39. The buried layer 40 made of the high-refractive index resin, such as the siloxane system resin, containing therein the metallic oxide fine particle made of the titanium oxide or the like, for example, is formed on the silicon nitride layer 39 by utilizing a spin coat method at the deposition temperature of about 400° C. so as to have a thickness of about 0.5 μm. At the same time, the buried layer 40 made of the high-refractive index resin is also buried in the entire hole portion 50 through the silicon nitride layer 39. In addition, for example, after the buried layer 40 made of the high-refractive index resin is formed, a post exposure bake treatment, for example, is carried out at a temperature of about 300° C. as may be necessary. In addition, when the high-refractive index resin is a polyimide resin, the buried layer 40, for example, can be formed at a temperature of about 350° C.

Figure 5G:
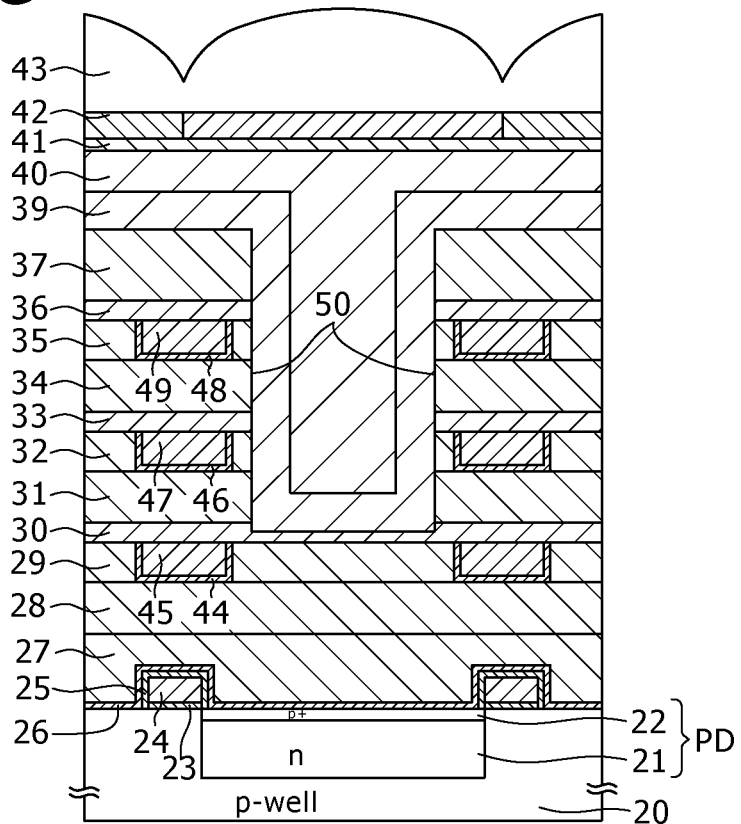

Next, as shown in FIG. 5G, the planarizing resin layer 41, for example, serving as the adhesive layer as well is formed on the buried layer 40, and the color filter 42 of, for example, blue (B), green (G) and red (R) is formed every pixel on the planarizing resin layer 41. In addition, the on-chip lens 43 is formed on the color filter 42. These structures are made by utilizing the same method as the known method.

By carrying out the processes described above, it is possible to manufacture the MOS type solid-state image pickup element according to the embodiment of the present invention.

Figure 6:
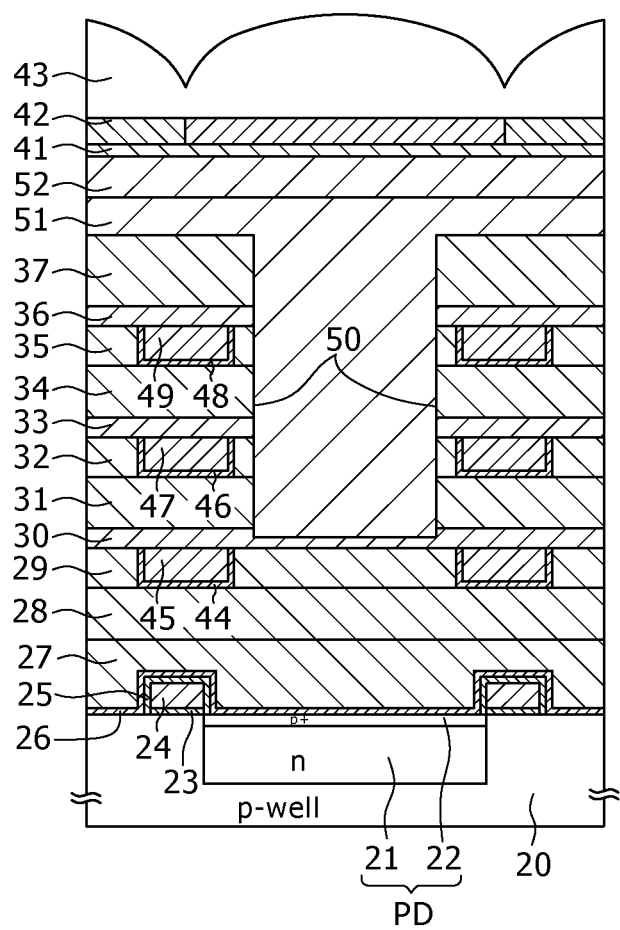
FIG. 6 is a cross sectional view showing a first modified structure of the solid-state image pickup element according to the embodiment of the present invention.

Change 1 of Embodiment of Method of Manufacturing Solid-State Image Pickup Element: Waveguide Structure Formed by Using only Silicon Nitride Layer Although in the processes described above, during the burying of the hole portion 50, the silicon nitride layer 39 is formed on the inner surface of the hole portion 50, and the buried layer 40 is buried in the entire hole portion 50 through the silicon nitride layer 39, alternatively, only the silicon nitride layer may be buried in the entire hole portion 50. FIG. 6 shows a cross sectional view of a structure of a unit pixel of a MOS type solid-state image pickup element manufactured by utilizing this method. It should be noted that in the MOS type solid-state image pickup element shown in FIG. 6, the same constituent elements as those shown in FIG. 2 are designated by the same reference numerals, respectively, and a detailed description thereof is omitted here for the sake of simplicity.

In the MOS type solid-state image pickup element shown in FIG. 6, the fifth to ninth insulating layers 31, 32, 34, 35, and 37, and the second and third diffusion preventing layers 33 and 36 are selectively etched away to open the hole portion 50 by utilizing the same method as that for formation of the hole portion 50 previously described with reference to FIG. 5D. Also, a silicon nitride layer 51 is buried in the entire hole portion 50 by utilizing both the ALD method and the plasma deposition method.

The silicon nitride layer 51 covers an inner surface having an inner wall and a bottom portion of the hole portion 50, and also covers the ninth insulating layer 37. Thus, there is adopted such a structure that the silicon nitride layer 51 is buried in the entire hole portion 50.

The ALD-SiN layer described above can be formed under the deposition conditions for the ALD method when the adsorption of Si described above is set as the step 1, and the nitriding of the adsorbed Si is set as the step 2. In addition, the P—SiN layer can be formed by utilizing the plasma CVD method in which the film temperature is set at about 380° C.

After completion of the formation of the silicon nitride layer 51, a passivation layer 52 made of a high-refractive index resin or the like is formed on the silicon nitride layer 51. In addition, the planarizing resin layer 41 serving as the adhesive layer as well is formed on the passivation layer 52, and the color filter 42 of, for example, blue (B), green (G) and red (R) is formed every pixel on the planarizing resin layer 41. Moreover, the on-chip lens 43 is formed on the color filter 42, thereby making it possible to manufacture the MOS type solid-state image pickup element shown in FIG. 6.

In the case where in the MOS type solid-state image pickup element shown in FIG. 6, the silicon nitride layer 51 is buried in the entire hole portion 50, when only the ALD-SiN layer is formed, the deposition rate of the ALD-SiN layer formed by utilizing the ALD method is low although the silicon nitride layer needs to be thickly formed. For this reason, it may be impossible to obtain the realistic throughput in the manufacture processes in the case of the actual mass production or the like of the MOS type solid-state image pickup element in the process for forming the silicon nitride layer 51. In order to cope with such a situation, the ALD-SiN layer which is excellent in coatability is combined with the P—SiN layer which is high in deposition rate. As a result, the formation rate of the silicon nitride layer 51 can be enhanced, and thus the realistic throughput can be obtained in the processes for manufacturing the MOS type solid-state image pickup element.

In the process for forming the silicon nitride layer 51, any of the ALD-SiN layer and the P—SiN layer may be firstly formed in the hole portion 50. In addition, the ALD-SiN layer and the P—SiN layer may be alternately laminated, thereby forming the silicon nitride layer 51 in the entire hole portion 50.

In addition, in the MOS type solid-state image pickup element having the structure shown in FIG. 6, the silicon nitride layer 51 is formed from the ALD-SiN layer and the P—SiN layer, and is buried in the entire hole portion 50. Therefore, it is unnecessary to provide the high-refractive index resin layer in the hole portion 50. For this reason, since only the silicon nitride layer having the high refractive index is filled in the waveguide structure, it is possible to manufacture the MOS type solid-state image pickup element which is excellent in sensitivity characteristics.

Figure 7:
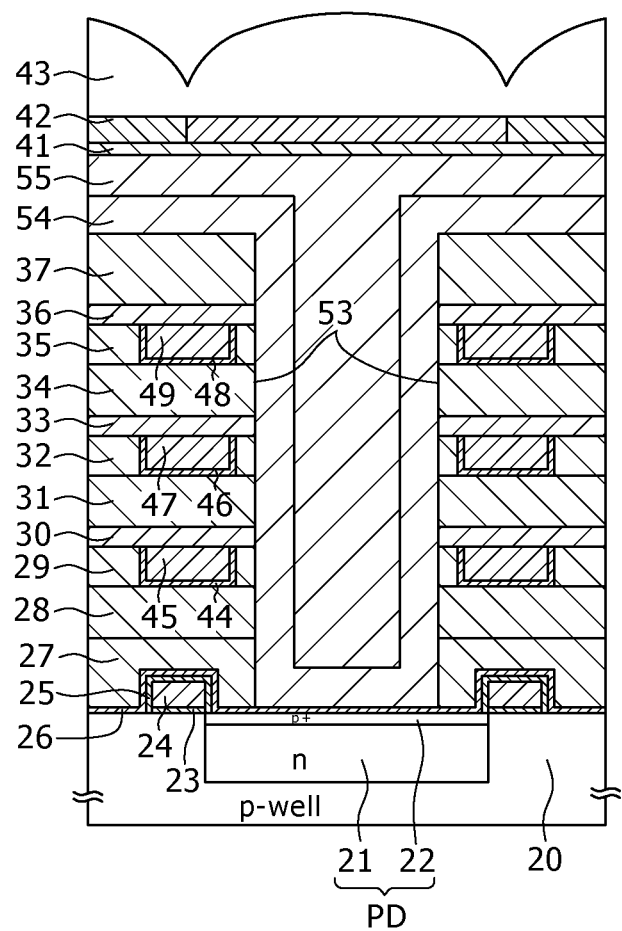
FIG. 7 is a cross sectional view showing a second modified structure of the solid-state image pickup element according to the embodiment of the present invention.

Change 2 of Embodiment of Method of Manufacturing Solid-State Image Pickup Element: Waveguide Structure Having Hole Portion Formed to Deep Portion of Insulating Layers In addition, although with the embodiment of the manufacturing method, the etching for forming the hole portion 50 is made to be stopped at the first diffusion preventing layer 30, the hole portion may be formed below the first diffusion preventing layer 30. For example, a hole portion which extends completely to the second insulating layer 27, and thus a hole portion 53 can be formed with the anti-reflection layer 26 as an etching stopper. FIG. 7 shows a cross sectional view of a structure of a unit pixel of a MOS type solid-state image pickup element manufactured by utilizing this method. It should be noted that in the MOS type solid-state image pickup element shown in FIG. 7, the same constituent elements as those shown in FIG. 2 are designated by the same reference numerals, respectively, and a detailed description thereof is omitted here for the sake of simplicity.

In the MOS type solid-state image pickup element shown in FIG. 7, the second to ninth insulating layers 27, 28, 29, 31, 32, 34, 35, and 37, and the first to third diffusion preventing layers 30, 33 and 36 are laminated in the order of ascending reference numerals by utilizing the same method as that described with reference to FIGS. 5B and 5C. Also, similarly to the case of the process described with reference to FIG. 5D, for example, a pattern of a photo resist layer is formed by utilizing the photolithography process, and the anisotropic etching such as the reactive ion etching is carried out for the second to ninth insulating layers 27, 28, 29, 31, 32, 34, 35, and 37, and the first to third diffusion preventing layers 30, 33 and 36. During this etching, as shown in FIG. 7, the hole portion 53 is formed so as to extend perfectly through the second to ninth insulating layers 27, 28, 29, 31, 32, 34, 35, and 37, and the first to third diffusion preventing layers 30, 33 and 36. At this time, the anti-reflection layer 26 formed from the LP-SiN layer and formed on the photodiode PD can be used as an etching stopper against the anisotropic etching.

Also, a silicon nitride (ALD-SiN) layer 54 is formed so as to cover an inner surface having an inner wall and a bottom portion of the hole portion 53, and cover the ninth insulating layer 37 by utilizing the ALD method. The ALD-SiN layer can be formed under the deposition conditions for the ALD method in which the adsorption of Si described above is set as the step 1, and the nitriding of adsorbed Si is set as the step 2.

In addition, the silicon nitride layer 54 may also be formed by combining the ALD-SiN layer with the silicon nitride (P—SiN) layer formed by utilizing the plasma deposition method.

Next, a buried layer 55 made of a high-refractive index resin is formed on the silicon nitride layer 54 in the hole portion 53 by utilizing the same method as that described with reference to FIG. 5F. The buried layer 55 made of the high-refractive index resin, such as the siloxane system resin, containing therein the metallic oxide fine particle made of the titanium oxide or the like, for example, is formed on the silicon nitride layer 54 and buried in the hole portion 53 by utilizing a spin coat method at the deposition temperature of about 400° C.

In addition, the planarizing resin layer 41 serving as the adhesive layer as well is formed on the buried layer 55, and the color filter 42 of, for example, blue (B), green (G) and red (R) is formed every pixel on the planarizing resin layer 41. Moreover, the on-chip lens 43 is formed on the color filters 42, thereby making it possible to manufacture the MOS type solid-state image pickup element shown in FIG. 7.

In the MOS type solid-state image pickup element having the structure shown in FIG. 7, the hole portion is formed to the deep portion of the laminated insulating layers, and the waveguide structure is formed close to the photodiode PD. For this reason, the waveguide effect can be dramatically enhanced in the MOS type solid-state image pickup element, and it is possible to manufacture the MOS type solid-state image pickup element which is excellent in sensitivity characteristics.

In addition, in the silicon nitride (ALD-SiN) layer formed by utilizing the ALD method described above, the fixed charges in the ALD-SiN layer can be controlled by the lowering of the deposition temperature, and the increasing of the RF power. Specifically, it is possible to reduce the positive fixed charges in the ALD-SiN layer. For example, the ALD-SiN layer is formed under the condition that the deposition temperature is set at 475° C. or less, and the RF power is set at about 350 W or more, thereby obtaining a flat band voltage Vfb which is either equal to or surpass that in the LP-SiN layer formed on the photodiode PD. In such a manner, the flat band voltage Vfb of the ALD-SiN layer can be remarkably improved by the lowering of the deposition temperature, and the increasing of the RF output power in the manufacture conditions. As a result, it becomes possible to suppress the off-Pinning of the sensor portion, and it also becomes possible to improve the dark current characteristics.

For formation of the hole portion of the existing waveguide structure, the resist pattern is formed so as to correspond to the waveguide pattern by utilizing the photolithography process, and the oxide films are selectively etched away with the resist pattern as the mask, thereby forming the hole portion. The etching for the hole portion is stopped at the etching stopper film made of SiC as the wiring lowermost layer. The reason for this is because the noises (due to the dark current and the white point) are reduced.

However, as described above, with the ALD method, the control for the fixed charges in the ALD-SiN layer, and the reduction of the positive fixed charges in the ALD-SiN layer become possible by the lowering of the deposition temperature, and the increasing of the RF output power. For this reason, it is possible to suppress the off-Pinning in the photodiode PD, and it is also possible to improve the dark current characteristics. Also, the etching for formation of the hole portion needs not to be stopped at the etching stopper layer as the wiring lowermost layer, for example, the first diffusion preventing layer 30 of the MOS type solid-state image pickup element 12 shown in FIG. 2. As a result, the waveguide length can be deeply formed. Therefore, it is possible to dramatically enhance the waveguide effect.

It is noted that only the silicon nitride layer can also be buried in the entire hole portion 53 of the MOS type solid-state image pickup element shown in FIG. 7 by application of the method of manufacturing the MOS type solid-state image pickup element described with reference to FIG. 6. With such a structure, it is possible to enhance the waveguide effect by forming deeply the waveguide length. In addition thereto, only the silicon nitride layer having the high refractive index is buried in the entire inside of the waveguide structure, whereby it is possible to enhance the sensitivity characteristics of the MOS type solid-state image pickup element, and the dependency of the sensitivity on the F number.

According to the manufacturing method described above, the enhancement of the sensitivity can be further expected in the case where only the SiN layer having the high refractive index is buried in the entire hole portion composing the waveguide than in any other case, for example, shown in FIG. 6. With regard to the manufacturing method concerned, it is possible to use both the ALD-SiN layer having the excellent coatability, and the P—SiN layer which is excellent in deposition rate. Since with the ALD-SiN system, the deposition rate is very slow, it may be impossible to obtain the realistic throughput. On the other hand, by using the P—SiN layer in combination, it is possible to obtain the throughput having the possibility in mass production.

3. Electronic Apparatus

The MOS type solid-state image pickup element of the embodiment of the present invention can be applied to an electronic apparatus such as a camera including a solid-state image pickup element, a mobile apparatus with a camera, or other apparatuses each including a solid-state image pickup element.

Figure 8:
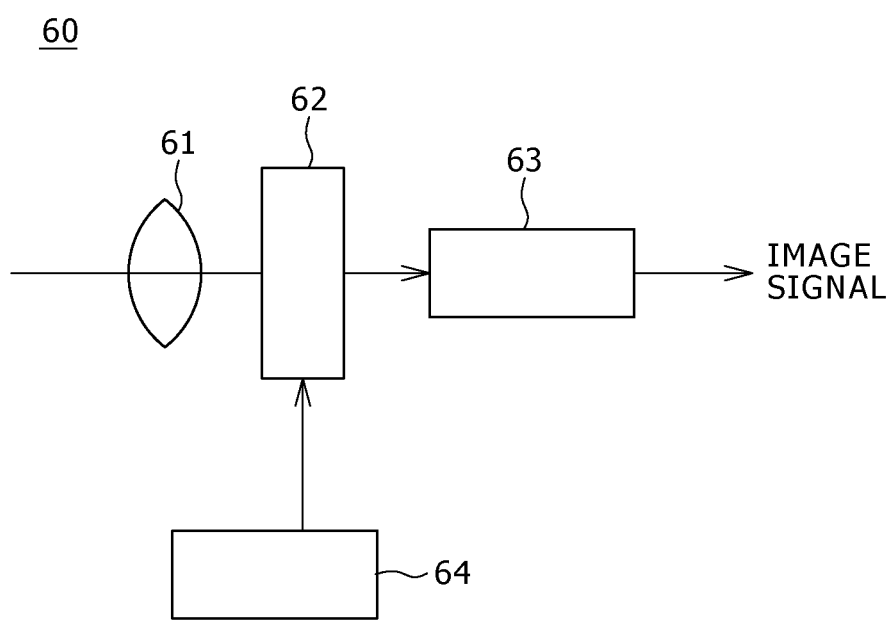
FIG. 8 is a schematic view showing a configuration of an electronic apparatus according to still another embodiment of the present invention.

FIG. 8 shows a schematic configuration when the MOS type solid-state image pickup element is applied to a digital still camera which can photograph a still image as an embodiment of the electronic apparatus of the present invention.

The digital still camera 60 includes an optical system (optical lens) 61, the MOS type solid-state image pickup element 62, a signal processing circuit 63, and a drive circuit 64.

The MOS type solid-state image pickup element described above is applied to the MOS type solid-state image pickup element 62. The optical lens 61 images an image light (incident light) from a subject on an imaging area of the MOS type solid-state image pickup element 62. As a result, the signal charges are accumulated in the photoelectric conversion element of the MOS type solid-state image pickup element 62 for a given period of time. The drive circuit 64 supplies a transfer operation signal of the MOS type solid-state image pickup element 62. Signal transfer is carried out in the MOS type solid-state image pickup element 62 in accordance with a drive signal (timing signal) supplied from the drive circuit 64. The signal processing circuit 63 executes various kinds of signal processing for an output signal from the MOS type solid-state image pickup element 62. An image signal obtained through the various kinds of signal processing in the signal processing circuit 63 is stored in a storage medium such as a memory, and is then outputted to a monitor or the like. The digital still camera 60 of the embodiment includes a form of a camera module into which the optical lens 61, the MOS type solid-state image pickup element 62, the signal processing circuit 63, and the drive circuit 64 are modularized.

The embodiment of the present invention can configure the digital still camera 60 shown in FIG. 8, or a mobile apparatus with a camera, for example, typified by a mobile phone including a camera module.

In addition, the digital still camera 60 shown in FIG. 8 can be configured in the form of a module, having an image pickup function, into which the optical lens 61, the MOS type solid-state image pickup element 62, the signal processing circuit 63, and the drive circuit 64 are modularized, a so-called image pickup functional module. Thus, the embodiment can configure an electronic apparatus including such an image pickup functional module.

It is noted that although in the MOS type solid-state image pickup element described above, the FD region of the second conductivity type, and the PD region of the second conductivity type and the PD region of the first conductivity type are formed in the semiconductor region of the first conductivity type, for example, the p-type which is formed in the semiconductor substrate of the second conductivity type, for example, the n-type, the n-type and the p-type may be reversed to each other.

The present application contains subject matter related to that disclosed in Japanese Priority Patent Application JP 2009-135236 filed in the Japan Patent Office on Jun. 4, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A solid-state image pickup element, comprising:
a semiconductor substrate;
a pixel portion on the semiconductor substrate and in which a plurality of pixels each having a photoelectric conversion portion are arranged;
an anti-reflection layer covering the semiconductor substrate and being disposed above a gate electrode of each pixel;
a first insulating layer covering the gate electrode and being interposed between the gate electrode and the anti-reflection layer, the first insulating layer being disposed directly on the gate electrode and the anti-reflection layer being disposed directly on the first insulating layer;
a second insulating layer disposed directly on the anti-reflection layer;

a plurality of insulating layers that are separate from the first and second insulating layers and that are on the second insulating layer;

a hole portion in the plurality of insulating layers and the second insulating layer, the hole portion penetrating through the second layer down to the anti-reflection layer and being respectively provided above each photoelectric conversion portion, wherein the hole portion has an aspect ratio of about 1 or greater;

a silicon nitride layer formed so as to cover a bottom surface and a side surface of the hole portion, the side surface having a top end and a bottom end, wherein the silicon nitride layer is formed by performing a first process and a second process sequentially and alternatively in any order, wherein the first process forms a silicon nitride layer by utilizing an atomic layer deposition method, and the second process forms a silicon nitride layer by utilizing a plasma chemical vapor deposition method, wherein the first process and the second process are alternately laminated, wherein at least one of the first process and the second process is performed more than once, wherein the atomic layer deposition deposits a set of atomic layers wherein each of the atomic layers in the hole portion has a thickness between about 0.6 to about 1.2 angstrom of silicon nitride;

and a buried layer formed on the silicon nitride layer, wherein a thickness of the silicon nitride layer is substantially the same at the top end and at the bottom end.

2. The solid-state image pickup element according to claim 1, wherein the buried layer is a resin layer having a refractive index higher than a refractive index of silicon oxide.

3. The solid-state image pickup element according to claim 1, wherein the hole portion penetrates through a plurality of diffusion prevention layers.

4. The solid-state image pickup element according to claim 1, wherein a bottom surface of the silicon nitride is in contact with a top surface of the anti-reflection layer.

5. The solid-state image pickup element according to claim 1, wherein the silicon nitride is in contact with each of the plurality of insulating layers, the second insulating layer, and the anti-reflection layer.

6. The solid-state image pickup element according to claim 1, wherein the buried layer comprises at least one metallic oxide fine particle.

7. The solid-state image pickup element according to claim 6, wherein the buried layer comprises siloxane and the at least one metallic oxide fine particle comprises TiO.

8. A method of manufacturing a solid-state image pickup element, comprising the steps of:
forming a photoelectric conversion portion in a pixel portion of a semiconductor substrate;
forming an anti-reflection layer covering the semiconductor substrate and being disposed above a gate electrode;
forming a first insulating layer covering the gate electrode and being interposed between the gate electrode and the anti-reflection layer, the first insulating layer being formed directly on the gate electrode and the anti-reflection layer being formed directly on the first insulating layer;
forming a second insulating layer directly on the anti-reflection layer;
forming a plurality of insulating layers that are separate from the first and second insulating layers on the second insulating layer;
forming a hole portion in the plurality of insulating layers and the second insulating layer, the hole portion being formed so as to penetrate through the second insulating layer down to the anti-reflection layer and being formed above the photoelectric conversion portion, wherein the hole portion is further formed to have an aspect ratio of about 1 or greater; and
forming a silicon nitride layer in the hole portion so as to cover a bottom surface and a side surface of the hole portion, the side surface having a top end and a bottom end, wherein the silicon nitride layer is formed by performing a first process and a second process sequentially and alternatively in any order, wherein the first process forms a silicon nitride layer by utilizing an atomic layer deposition method, and the second process forms a silicon nitride layer by utilizing a plasma chemical vapor deposition method, wherein the first process and the second process are alternately laminated, wherein at least one of the first process and the second process is performed more than once, and wherein the atomic layer deposition deposits a set of atomic layers wherein each of the atomic layers in the hole portion has a thickness between about 0.6 to about 1.2 angstrom of silicon nitride.

9. The method of manufacturing the solid-state image pickup element according to claim 8, wherein the silicon nitride layer is formed by performing the atomic layer deposition method and the plasma chemical vapor deposition method sequentially.

10. The method of manufacturing the solid-state image pickup element according to claim 8, further comprising the step of forming a buried layer made of a resin on the silicon nitride layer after the silicon nitride layer is formed, the buried layer having a refractive index higher than a refractive index of silicon oxide.

11. The method of manufacturing the solid-state image pickup element according to claim 8, wherein the hole portion is formed via an etching process.

12. The method of manufacturing the solid-state image pickup element according to claim 8, wherein the hole portion is formed so as to penetrate through a plurality of diffusion prevention layers.

13. The method of manufacturing the solid-state image pickup element according to claim 8, wherein the silicon nitride is formed so that a bottom surface of the nitride is in contact with a top surface of the anti-reflection layer.

14. The method of manufacturing the solid-state image pickup element according to claim 8, wherein the silicon nitride is formed so that the silicon nitride is in contact with each of the plurality of insulating layers, the second insulating layer, and the anti-reflection layer.

15. The method of manufacturing the solid-state image pickup element according to claim 8, wherein the buried layer comprises at least one metallic oxide fine particle.

16. The method of manufacturing the solid-state image pickup element according to claim 8, wherein the atomic layer deposition method is controlled during the forming the silicon nitride layer to reduce positive fixed charges in the silicon nitride layer by lowering a deposition temperature from between about 320° C. and 600° C. and simultaneously increasing a RF power from between about 100 W to about 500 W.

17. An electronic apparatus, comprising:
a solid-state image pickup element including (i) a semiconductor substrate, (ii) a pixel portion on the said semiconductor substrate and in which a plurality of pixels each having a photoelectric conversion portion are arranged, (iii) an anti-reflection layer covering the semiconductor substrate and being disposed above a gate electrode of each pixel, (iv) a first insulating layer covering the gate electrode and being interposed between the gate electrode and the anti-reflection layer, the first insulating layer being disposed directly on the gate electrode and the anti-reflection layer being disposed directly on the first insulating layer, (v) a second insulating layer disposed directly on the anti-reflection layer, (vi) a plurality of insulating layers that are separate from the first and second insulating layers and that are on the second insulating layer, (vii) a hole portion formed in the plurality of insulating layers and the second insulating layer, the hole portion penetrating through the second layer down to the anti-reflection layer and being respectively provided above each said photoelectric conversion portion, wherein the hole portion has an aspect ratio of about 1 or greater, (viii) a silicon nitride layer formed so as to cover a bottom surface and a side surface of the hole portion, the side surface having a top end and a bottom end, wherein the silicon nitride layer is formed by performing a first process and a second process sequentially and alternatively in any order, wherein the first process forms a silicon nitride layer by utilizing an atomic layer deposition method, and the second process forms a silicon nitride layer by utilizing a plasma chemical vapor deposition method, wherein the first process and the second process are alternately laminated, wherein at least one of the first process and the second process is performed more than once, and wherein the atomic layer deposition deposits a set of atomic layers wherein each of the atomic layers in the hole portion has a thickness between about 0.6 to about 1.2 angstrom of silicon nitride; and (ix) a buried layer formed on the said atomic layer deposited silicon nitride layer, wherein a thickness of the silicon nitride layer is substantially the same at the top end and at the bottom end; an optical system for guiding an incident light to an image pickup portion of the solid-state image pickup element; and a signal processing circuit for processing an output signal from the solid-state image pickup element.

18. A solid-state device, comprising:
a substrate with a pixel having a photodiode in the substrate;
a gate electrode on the substrate with a gate insulating layer therebetween;
a first insulating layer surrounding and conforming to a shape of all of the gate electrode except that portion of the gate electrode facing the substrate;
an anti-reflection layer on the substrate and over the gate electrode, the anti-reflection layer covering and conforming to the shape of all of the gate electrode except that portion of the gate electrode facing the substrate;
a second insulating layer on the anti-reflection layer;
a plurality of further insulating layers over the second insulating layer; a hole extending through the plurality of further insulating layers, the hole being over the photodiode and having an aspect ratio of about 1 or greater;
a silicon nitride layer formed so as to cover a bottom surface and a side surface of the hole portion, the side surface having a top end and a bottom end, wherein the silicon nitride layer is formed by performing a first process and a second process sequentially and alternatively in any order, wherein the first process forms a silicon nitride layer by utilizing an atomic layer deposition method, and the second process forms a silicon nitride layer by utilizing a plasma chemical vapor deposition method, wherein the first process and the second process are alternately laminated, wherein at least one of the first process and the second process is performed more than once, wherein the atomic layer deposition deposits a set of atomic layers wherein each of the atomic layers in the hole portion has a thickness between about 0.6 to about 1.2 angstrom of silicon nitride; and
a buried layer formed on the atomic layer deposited silicon nitride layer;
wherein a thickness of the atomic layer deposited silicon nitride layer is substantially the same at the top end and at the bottom end.

19. The solid-state device of claim 18, wherein the hole extends to the anti-reflection layer.

\* \* \* \* \*